(12) United States Patent
LaBerge

(10) Patent No.: US 7,222,325 B2
(45) Date of Patent: *May 22, 2007

(54) METHOD FOR MODIFYING AN INTEGRATED CIRCUIT

(76) Inventor: Paul A. LaBerge, 5772 Ridge Creek Rd. Ct., Shoreview, MN (US) 55126

( * ) Notice: Subject to any disclaimer, the term of this patent is extended or adjusted under 35 U.S.C. 154(b) by 385 days.

This patent is subject to a terminal disclaimer.

(21) Appl. No.: 10/613,653

(22) Filed: Jul. 3, 2003

(65) Prior Publication Data

US 2004/0098702 A1 May 20, 2004

Related U.S. Application Data

(60) Division of application No. 09/672,649, filed on Sep. 28, 2000, now Pat. No. 6,601,228, which is a continuation of application No. 09/010,337, filed on Jan. 21, 1998, now Pat. No. 6,209,118.

(51) Int. Cl.
*G06F 17/50* (2006.01)
(52) U.S. Cl. .................. 716/17; 716/1; 716/16
(58) Field of Classification Search .................... 716/1, 716/2, 8–17; 326/38–41, 47, 101
See application file for complete search history.

(56) References Cited

U.S. PATENT DOCUMENTS

| | | | |
|---|---|---|---|
| 5,089,973 A | 2/1992 | Fuetek | |
| 5,122,685 A | 6/1992 | Chan et al. | |
| 5,220,213 A | 6/1993 | Chan et al. | |
| RE34,363 E | 8/1993 | Freeman | |
| 5,283,753 A | 2/1994 | Schucker et al. | |
| 5,338,983 A | 8/1994 | Agarwala | |
| 5,416,367 A | 5/1995 | Chan et al. | |
| 5,477,167 A | 12/1995 | Chua | |
| 5,587,669 A | 12/1996 | Chan et al. | |
| 5,594,364 A | 1/1997 | Chan et al. | |
| 5,732,246 A | 3/1998 | Gould et al. | |
| 5,745,734 A | 4/1998 | Croft et al. | |
| 5,754,826 A | 5/1998 | Gamal et al. | |
| 5,787,012 A * | 7/1998 | Levitt ........................... 716/1 |
| 5,825,202 A * | 10/1998 | Tavana et al. ................ 326/39 |
| 5,859,543 A | 1/1999 | Kolze | |
| 5,936,868 A | 8/1999 | Hall | |
| 5,943,488 A | 8/1999 | Raza | |
| 6,020,755 A | 2/2000 | Andrews et al. | |
| 6,054,872 A * | 4/2000 | Fudanuki et al. ............. 326/39 |
| 6,075,381 A | 6/2000 | LaBerge | |
| 6,209,118 B1 | 3/2001 | LaBerge | |

* cited by examiner

*Primary Examiner*—Vuthe Siek
(74) *Attorney, Agent, or Firm*—Dorsey & Whitney LLP

(57) ABSTRACT

An application specific integrated circuit has at least one standard cell, integrated circuit connection circuitry connected to the at least one standard cell and at least one programmable circuit that is connected or selectively connectable to the integrated circuit connection circuitry. The selected connection is made by metal mask changes if and when it is desirable to change the logic of the application specific circuit. The programmable circuit is a general-purpose logic block and may be reprogrammed to effect design changes.

8 Claims, 2 Drawing Sheets

METHOD FOR MODIFYING AN INTEGRATED CIRCUIT

This application is a divisional application of U.S. patent application Ser. No. 09/672,649, filed Sep. 28, 2000, now U.S. Pat. No. 6,601,228, which is a continuation of U.S. patent application Ser. No. 09/010,337, filed Jan. 21, 1998, now U.S. Pat. No. 6,209,118, which is related to an application titled "A Programmable Logic Block in an Integrated Circuit, application Ser. No. 09/010,335, filed Jan. 21, 1998, now U.S. Pat. No. 6,075,381.

BACKGROUND OF THE INVENTION

1. Field of the Invention

The present invention relates generally to application specific integrated circuits (ASICs). More particularly, the present invention relates to a method for constructing a standard cell ASIC and a structure for a standard cell ASIC that speeds metal mask changes and permits logic changes by programming configuration bits.

2. Description of the Prior Art

Integrated circuits are increasingly complex and the demands of technology cause the designs to be updated or changed constantly. Errors can be made and designs can almost always be improved. It is desirable that design changes be implemented with a minimal redesign of the chip. A fundamental redesign may take weeks and be followed by many days in which the multiple steps for manufacture of the newly-designed chips must be executed.

In traditional standard cell ASICs, the chip designers may add spare logic gates for use in making design modifications when testing reveals problems. These modifications are often effected by defining changes in the metal mask to make a new metal mask. Metal mask changes can speed the turnaround time for modifications, because the base layer masks need not be changed and modified chips can be fabricated from previously-made dies completed only to the stage before the first metal layer is placed ("metal one stage"). The spare logic gates are connected by the new metal mask and problems found in checkout testing can be corrected quickly.

Normally, the spare gates have their inputs tied low or high until they are used in a metal mask change. When the spare gates must be used to form a complex logic function, many of the spare gates must be connected together. The design of the connections needed to implement the desired complex logic function from a group of spare gates may involve considerable time and effort by the logic designer and layout editor in creating a new metal mask.

For some chips, connection changes can be made by focussed ion beam processing. To the extent a focussed ion beam method is used for connecting up spare gates on chips, this method is expensive and effective for short connection paths only. The probability of a defect increases with the length of connection and the number of connections. Additionally, each chip modified must be processed individually.

Field programmable gate arrays (FPGAs) have been used in some applications to permit quick turn-around time with no Non-recurring engineering (NRE) cost, but at a high per chip cost (in some cases, in the hundreds of dollars). In anti-fuse type FPGAs, certain gate arrays are programmable by placing the chip in a special device that burns out certain connections. In SRAM type FPGAs, the programming information is written into an SRAM that is used to enable the extra gates. However, FPGAs of either type are relatively expensive, often slow and may not be able to implement many logic functions. In addition, each FPGA to be programmed must be handled individually.

Thus, there exists a need for a more effective approach for designing a standard cell ASIC capable of being logically modified.

SUMMARY OF THE INVENTION

An application specific integrated circuit has at least one standard cell, integrated circuit connection circuitry connected to the at least one standard cell and at least one programmable circuit that is selectively connectable to the integrated circuit connection circuitry. The connection is made by metal mask changes. The programmable circuit is a general-purpose logic block.

The invention also encompasses a method for modifying the logic of an application specific integrated circuit having integrated circuit connection circuitry comprising:

(a) placing at least one programmable circuit on a die before the metal one stage;

(b) if logic modifications are needed, then connecting the at least one programmable circuit to the integrated circuit connection circuitry in the metal one stage such that the design modifications may be implemented; and (c) configuring the at least one programmable circuit such that the design modifications may be implemented.

DETAILED DESCRIPTION

1.0 General Overview

Figure 1:
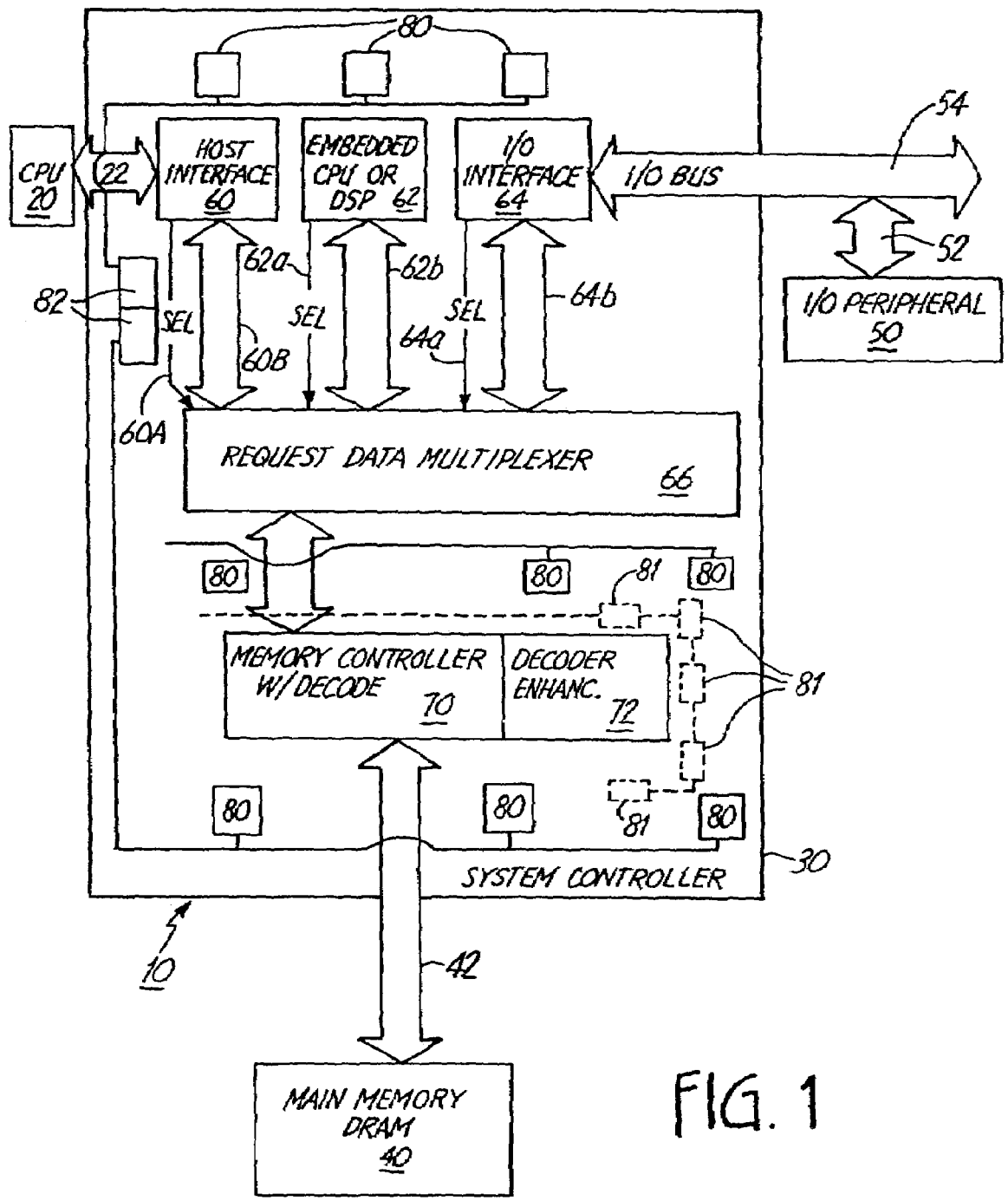
FIG. 1 is a block diagram of the major functional components of a computer system, including a system controller that is an ASIC in which the present invention may be implemented.

FIG. 1 shows the major functional components of a computer system 10 in which the present invention may be implemented. These include a CPU 20, a system controller 30, a main memory 40 and an I/O peripheral 50. The system controller 30 may be implemented on a single chip and may be an ASIC. The system controller 30 will be used herein as an example of how the present invention may be implemented, although it will be clear that the methodology taught herein may be used in any standard cell ASIC and in similar integrated circuits. The functional components that may be part of the system controller 30 are a host interface 60, an embedded CPU or DSP 62, an I/O interface 64, a request/data multiplexer 66, a memory controller (with decoding circuitry) 70 and decoder enhancements 72. These are implemented in whole or in part in standard cells.

The CPU 20 is connected to the host interface 60 by a host bus 22. The main memory 40 is connected to the memory controller 70 with a memory bus 42. The I/O peripheral 50 is connected by peripheral bus 52 to an I/O bus 54, which is, in turn, connected to the I/O interface 64.

Within the system controller 30, the host interface 60 is connected to the request/data multiplexer 66 by a first SEL line 60a and a first internal bus 60b. The embedded CPU or DSP 62 is connected to the request/data multiplexer 66 by a second SEL line 62a and a second internal bus 62b. The I/O interface 64 is connected to the request/data multiplexer 66 by a third SEL line 64a and a third internal bus 64b. The memory controller 70 is connected to the request/data multiplexer 66 by a fourth internal bus 72.

Also included within the system controller 30 are a plurality of programmable circuits 80, each of which is operably connected to one of one or more configuration registers 82. These programmable circuits 80 may be used to effect design changes in the system controller 30, as further described below.

1.1 Integrated Circuit Connection Circuitry

Busses 60b, 62b, 64b, 72 and the first through third SEL lines 60a, 62a, 64a provide a plurality of internal connections within the ASIC chip that comprises system controller 30 and may be referred to as such. The host bus 22, memory bus 42 and I/O bus 54 provide a plurality of external inputs and outputs for the ASIC chip that comprises the system controller 30. These inputs and outputs may be implemented in the form of leads from the packaging for the chip. The packaging may be a dual-in-line (DIP) package, pin-in-hole package, leadless ceramic package, gull-wing or j-lead package, pin-grid array package, ball grid array, plastic ball grid array or EGA enhanced.

The internal connections together with the external inputs and outputs may be collectively referred to as the integrated circuit connection circuitry. The integrated circuit connection circuitry operably interconnects the circuits and functional blocks of logic built from standard cells that comprise the integrated circuit.

In one embodiment, the programmable circuits 80 are not initially connected to the integrated circuit connection circuitry of the system controller 30. Only after design changes have been effected and it is determined what programmable circuits 80 are to be used in the design changes will the programmable circuits 80 be selectively connected to the integrated circuit connection circuitry.

1.2 Programmable Circuits

The programmable circuits 80 are placed on a chip in order to permit easier modification of the circuit designs placed on the chip. The programmable circuits 80 may be designed into the chip from the beginning. They are then available to implement modifications without a fundamental redesign of the chip. This is done by two separate operations. First, the metal mask is redesigned to selectively connect the programmable circuits 80 into the integrated circuit connection circuitry, which carries the signals presented at the chip inputs and processed by the functional blocks and produces the signals delivered at the chip outputs. Second, each individual programmable circuit 80 may be programmed to produce the desired logic function that is needed for the design change.

To be able to produce the desired logic function for a design change, each programmable circuit 80 should be a general purpose logic block. This means that it may consist of several gates that can be used flexibly as building blocks and be configured and used with different inputs to produce a wide variety of logic functions. For example, the gates included in a general purpose logic block may permit the implementation of all possible Boolean transfer functions for up to a set (and relatively small) number of input variables (e.g., 2 to 5), as well as selected transfer functions for a much larger number of variables. A specific example of a general purpose logic block will be described below.

Once a programmable circuit 80 comprising a general purpose logic block has been connected into the integrated circuit connection circuitry on the chip, it can be programmed or configured to execute the desired logical function by providing one or more configuration bits or signals to its inputs. The configuration bits or signals may be stored in configuration registers 82 or other similar on-chip storage devices that are connected or connectable (via the redesigned metal mask) to the programmable circuit 80.

2.0 An Example Programmable Circuit

The following example is for purposes of illustration only and is not intended in a limiting sense.

Figure 2:
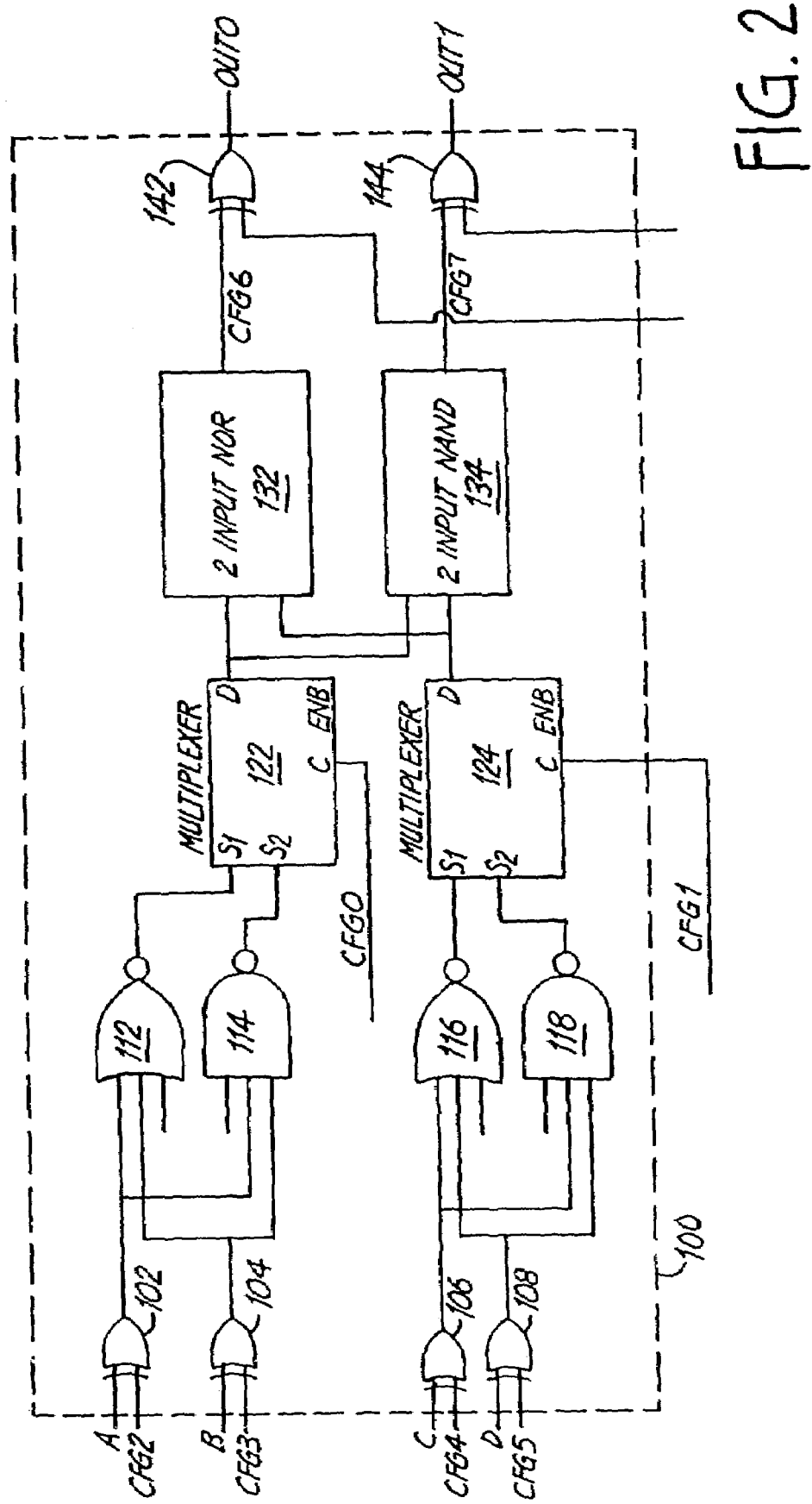
FIG. 2 is a block diagram of a programmable circuit for use in an ASIC in accordance with the present invention.

FIG. 2 shows a general purpose logic block 100 that may be used as a programmable circuit 80 (FIG. 1). The general purpose logic block 100 handles up to four logic inputs A, B, C, and D and up to eight configuration inputs CFG0 to CFG7. Logic block 100 consists of: four XOR input gates 102, 104, 106 and 108; two three-input NOR gates 112, 116; two three-input NAND gates 114, 118; two two-to-one multiplexers 122, 124; one two-input NOR gate 132, one two-input NAND gate 134; and two XOR output gates 142, 144.

The four XOR input gates 102, 104, 106 and 108 receive logic inputs A, B, C, D and configuration inputs CFG2 to CFG5. The outputs of the two XOR input gates 102 and 104 go to the three-input NOR gate 112 and the three-input NAND gates 114. Similarly, the outputs of the XOR input gates 106 and 108 go to the three-input NOR gate 116 and the three-input NAND gate 118. The outputs of three-input NOR gate 112 and the three-input NAND gate 114 go to two-to-one multiplexer 122, which is clocked by CFG0. The outputs of three-input NOR gate 116 and the three-input NAND gate 118 go to two-to-one multiplexer 124, which is clocked by CFG1. The outputs of the two two-to-one multiplexers 122, 124 go to both the two-input NOR gate 132 and the two-input NAND gate 134. The output of the two-input NOR gate 132 goes to XOR output gate 142 together with CFG6 to determine output signal OUT0, while the output of two-input NAND gate 134 goes to XOR output gate 144 together with CFG7 to determine output signal OUT1.

As can be seen, the general purpose logic block 100 can be connected into a surrounding circuit network (including, e.g., the integrated circuit connection circuitry of the system controller 30 of FIG. 1) and programmed to produce a variety of logic transfer functions. For example, a simple function of:

OUT0=(not-A AND B) OR (not-C AND D)

requires only five metal mask connections and programming in the configuration register 82 of CFG0–CFG6=1110100. By contrast, building the same function from spare gates would take about twelve connections.

Other suitable general purpose logic blocks are known in the art, because they are used in FPGAs, among other situations. For example, it is known that a logic cell consisting of two six-input AND gates, four two-input AND gates, three two-to-one multiplexers and a D flip-flop can be used to implement all possible Boolean transfer functions for up to three variables, as well as selected functions for up to fourteen variables. Specifically, the general purpose logic block used in QuickLogic's pAsic 1 internal logic cell is an FPGA cell which could be adapted to serve in much the same role as the circuit show in FIG. 2. (See "QuickLogic 1996–1997, p. 2–8, FIG. 7, published by QuickLogic Corporation)

3.0 Placement of Programmable Circuits on Chip

It is desirable that programmable circuits 80 be placed as close as possible to the circuits or functional blocks of logic within a particular chip to which they must be connected to make a design change. Proximity to a particular circuit or functional block of logic on the semiconductor die area occupied by the integrated circuit matters, because when the metal mask is redesigned to selectively connect one or more programmable circuits 80 into the network (integrated circuit connection circuitry) on the chip, the connection paths should be as short and simple as possible. This helps avoid timing problems, (such as latency and skew) and other problems.

Thus, there may be two approaches to placement of the programmable circuits 80 on a die, such as the die for the system controller 30 of FIG. 1. When it is not clear where on the chip a problem requiring a design modification may arise, a dispersed placement may be desired. This may be random, or as shown in FIG. 1, in a pattern that places the programmable circuits 80 in a predefined pattern spread over substantially the entire die.

Alternatively, where there is a foreseeable likely trouble spot, a group of programmable circuits 81 may be focussed on that area. For example, in FIG. 1, if most of the circuitry implemented on the chip is well-tested, i.e., it has been manufactured and used enough to be considered unlikely to contain errors or require modification, but a particular functional area, such as the decoder enhancement 72, is new and not yet considered fully reliable or a final design, then the programmable circuits 81 (shown in phantom) could all be clustered in the lower right-hand corner of the chip (as seen in FIG. 1). That is, the programmable circuits 81 can be localized to be in proximity to the elements that they may be expected to be connected to, if and when the circuitry as laid out in the original chip design needs to be modified.

4.0 Use of Programmable Circuits

The methodology using the programmable circuits 80/81 described above begins with the original circuit design and layout for the chip. Along with the standard cells and other original circuit design for the functions to be implemented, the designer determines what general purpose logic block (or blocks) will be used for the programmable circuits 80/81. This determination depends on the level of logical complexity that may be required to implement corrections of errors or other design changes and the available die space. The designer next determines the best locations for the programmable circuits 80/81. As discussed above, the locations may be dispersed or localized, depending on whether the areas likely to require use of programmable circuits 80/81 to effect modifications are foreseeable or not.

Next, chip preparation using all semiconductor layers is begun. A portion of the chip die batch is completely prepared by adding all metal and other layers and packaging. A portion of the chip dies is left unfinished before the "metal one" stage.

The finished chips are tested in whatever manner will reveal the need for any design modifications. Once the design modifications have been identified, the designer determines what logic is needed to make the design modifications and further determines what specific programmable circuits 80/81 will be used to implement this logic. A new circuit design is produced including the additional required logic, implemented by connecting the needed programmable circuits 80/81 to the existing circuits (i.e., the integrated circuit connection circuitry). The new circuit design results in a new metal mask to connect the programmable circuits 80/81 that are to be inserted by selective connection. It also results in a determination of the configuration signals (stored as configuration bits in the configuration registers(s) 82) that will be required for the inserted programmable circuits 80/81 to cause them to implement the desired logic.

Fabrication of the portion of the chips left unfinished before completing the "metal one" stage may be completed using the new metal mask. The designer then must assure that the device in which the chip will be used can provide the configuration signals at the right time. For example, in the case of a computer system 10 and a system controller 30 as shown in FIG. 1, the BIOS may be the source of configuration signals. The BIOS may need to be modified by reprogramming or generally re-configured to ensure that certain configuration registers 82 on the chip of the system controller 30 will be loaded with the configuration bits early in the boot up process. This ensures that the system controller 30 will be fully configured by the time it receives input signals that it must process into valid output signals.

Once a completed chip for a system controller 30 is ready and the configuration operation is accounted for, the modified chip can be inserted into the device where it is to be used. The BIOS or other method used to perform configuration is invoked. The modified chip is then able to operate using both the newly connected programmable circuits 80/81 and the configuration bits that are necessary to customize the programmable circuits 80/81 to perform the desired functions.

In an alternative embodiment, one or more programmable circuits 80/81 are made a part of the original chip design in a standard cell ASIC; that is, at least one such programmable circuit 80/81 is connected to the surrounding circuitry by the original metal mask without the need for (i.e., prior to the making of) a modified metal mask. Such a programmable circuit 80/81 can either be programmed to have a trivial, one-to-one (or identity) transfer function so that it has no logical effect on its input signals until it is programmed differently, or it can be programmed with configuration bits that cause it to perform a desired logical function along with the standard cells. Such a programmable circuit 80/81 can later, if necessary, be reprogrammed to perform a different logical function that effects a desired logical design modification without the need for a new metal mask and a new chip manufactured using that mask.

5.0 Conclusion

As can be seen, the methodology described above permits an ASIC chip design to be modified by use of configuration bits that modify the function of one or more general purpose logic blocks placed on the chip. This may be done with or without a limited number of metal changes to connect any general purpose logic block that is not yet connected to the circuitry requiring modification.

In one embodiment, a portion of the design modifications are performed by metal mask changes, with the rest of the design changes being achieved by programming with configuration bits. Alternatively, the programmable circuits are already connected by the original metal mask and only the programming with configuration bits is used to effect modifications.

Thus, it is apparent that given the significant amount of time and effort required to make each connection during a metal mask change, by reducing the number of connections during a metal mask change, the present invention provides a significant reduction in the time and effort required for a metal mask change. (E.g., in the example of Section 2.0 above, reducing the number of connections from 12 to 5 results in a large savings in time and cost). The time saved may be reflected in the lower amount of time that logic designer spends in layout design modifications and in finding routing tracks.

The present invention has been described relative to a computer system and particularly a personal computer. However, it will be apparent to those skilled in the art that the present invention may be used with other electronic devices in which standard cell ASICs are used. Accordingly, the invention is only limited as defined in the appended claims.

The invention claimed is:

1. A process for use in a manufacturing of application specific integrated circuits comprising the steps of:
   providing a semi-fabricated semiconductor wafer that lacks a metal one layer and on which has been formed a plurality of circuits that comprise a logic design and at least one programmable circuit capable of performing at least one of a plurality of logic transfer functions upon programming;
   determining modifications to the logic design that are desired by examining an original specimen of the application specific integrated circuit with a metal one layer;
   determining desired changes in the metal one layer needed to implement the modifications in the logic design, including connecting the at least one programmable circuit to the plurality of circuits; and
   forming a metal one layer on said semi-fabricated semiconductor wafer in the same location as the metal one layer of the original specimen but having a configuration different from the metal one layer of the original specimen to effect the desired changes.

2. The process of claim 1, wherein the act of forming the at least one programmable circuit comprises interconnecting the plurality of circuits by integrated circuit connection circuitry and connecting the at least one programmable circuit to the integrated circuit connection circuitry.

3. The process of claim 1, further comprising locating at least one configuration register on the semi-fabricated semiconductor wafer.

4. The process of claim 3, further comprising storing data for configuration signals in the at least one configuration register.

5. The process of claim 1, wherein the act of providing a semi-fabricated semiconductor wafer with at least one programmable circuit comprises providing at least one general purpose logic block that comprises the at least one programmable circuit.

6. The process of claim 1, wherein the act of determining whether modifications to the logic design are desired comprises testing a semiconductor wafer upon which the plurality of circuits have been interconnected by integrated circuit connection circuitry.

7. The process of claim 1, further comprising providing on the semi-fabricated semiconductor a configuration register for storing configuration information for the at least one programmable circuit.

8. The process of claim 1, wherein the act of providing an semi-fabricated semiconductor wafer with at least one programmable circuit comprises providing a plurality of general purpose logic blocks in a dispersed pattern on the wafer.

* * * * *